(12) United States Patent
Saether

(10) Patent No.: US 8,241,925 B2
(45) Date of Patent: Aug. 14, 2012

(54) CALIBRATION OF TEMPERATURE SENSITIVE CIRCUITS WITH HEATER ELEMENTS

(75) Inventor: Terje Saether, Trondheim (NO)

(73) Assignee: Atmel Corporation, San Jose, CA (US)

( * ) Notice: Subject to any disclaimer, the term of this patent is extended or adjusted under 35 U.S.C. 154(b) by 378 days.

(21) Appl. No.: 12/625,471

(22) Filed: Nov. 24, 2009

(65) Prior Publication Data

US 2011/0121292 A1    May 26, 2011

(51) Int. Cl.
*H01L 21/00* (2006.01)

(52) U.S. Cl. ............ 438/15; 438/17; 438/29; 438/57; 438/69; 257/E21.001; 257/E21.09; 257/E23.08; 257/E33.003

(58) Field of Classification Search ............ 438/12–17, 438/29, 57, 69, 479, 486; 257/E21.001, 9, 257/23.08, 33.003
See application file for complete search history.

(56) References Cited

U.S. PATENT DOCUMENTS

| | | | | |
|---|---|---|---|---|
| 4,488,824 A * | 12/1984 | Salem | ............ | 374/181 |
| 6,006,169 A * | 12/1999 | Sandhu et al. | ............ | 702/132 |
| 7,084,695 B2 * | 8/2006 | Porter | ............ | 327/512 |
| 7,180,380 B2 * | 2/2007 | Bienek et al. | ............ | 331/66 |
| 7,310,013 B2 * | 12/2007 | Porter | ............ | 327/512 |
| 2003/0158683 A1 * | 8/2003 | Gauthier et al. | ............ | 702/99 |
| 2006/0044047 A1 * | 3/2006 | Porter | ............ | 327/512 |
| 2006/0238267 A1 * | 10/2006 | Bienek et al. | ............ | 331/176 |
| 2006/0267668 A1 * | 11/2006 | Porter | ............ | 327/512 |
| 2009/0024349 A1 * | 1/2009 | Boerstler et al. | ............ | 702/132 |
| 2010/0213373 A1 * | 8/2010 | Meinel et al. | ............ | 250/338.4 |
| 2010/0213374 A1 * | 8/2010 | Meinel et al. | ............ | 250/338.4 |
| 2010/0213467 A1 * | 8/2010 | Lee et al. | ............ | 257/75 |
| 2011/0001571 A1 * | 1/2011 | Sutardja | ............ | 331/109 |

* cited by examiner

*Primary Examiner* — Michael Lebentritt
(74) *Attorney, Agent, or Firm* — Fish & Richardson P.C.

(57) ABSTRACT

One or more heating elements are disposed on a semiconductor substrate proximate a temperature sensitive circuit disposed on the substrate (e.g., bandgap circuit, oscillator). The heater element(s) can be controlled to heat the substrate and elevate the temperature of the circuit to one or more temperature points. One or more temperature measurements can be made at each of the one or more temperature points for calibrating one or more reference values of the circuit (e.g., bandgap voltage).

5 Claims, 3 Drawing Sheets

CALIBRATION OF TEMPERATURE SENSITIVE CIRCUITS WITH HEATER ELEMENTS

TECHNICAL FIELD

This subject matter is generally related to electronics, and more particularly to calibrating temperature sensitive circuits.

BACKGROUND

High performance analog circuits need to be calibrated at one or more temperature points to obtain a desired accuracy. In production, a wafer sort can be performed at high temperature (e.g., 85° C.) and a final test after packaging can be performed at room temperature (e.g., 25° C.) A problem with high performance analog circuits is that the packaging itself can change analog circuit parameters, making it necessary to calibrate the analog circuits after packaging which can cost time and money.

SUMMARY

One or more heating elements are disposed on a semiconductor substrate proximate a temperature sensitive circuit disposed on the substrate (e.g., bandgap circuit, oscillator). The heater element(s) can be controlled to heat the substrate and elevate the temperature of the circuit to one or more temperature points. One or more temperature measurements can be made at each of the one or more temperature points for calibrating one or more reference values of the circuit (e.g., bandgap voltage).

DETAILED DESCRIPTION

System Overview

Figure 1:
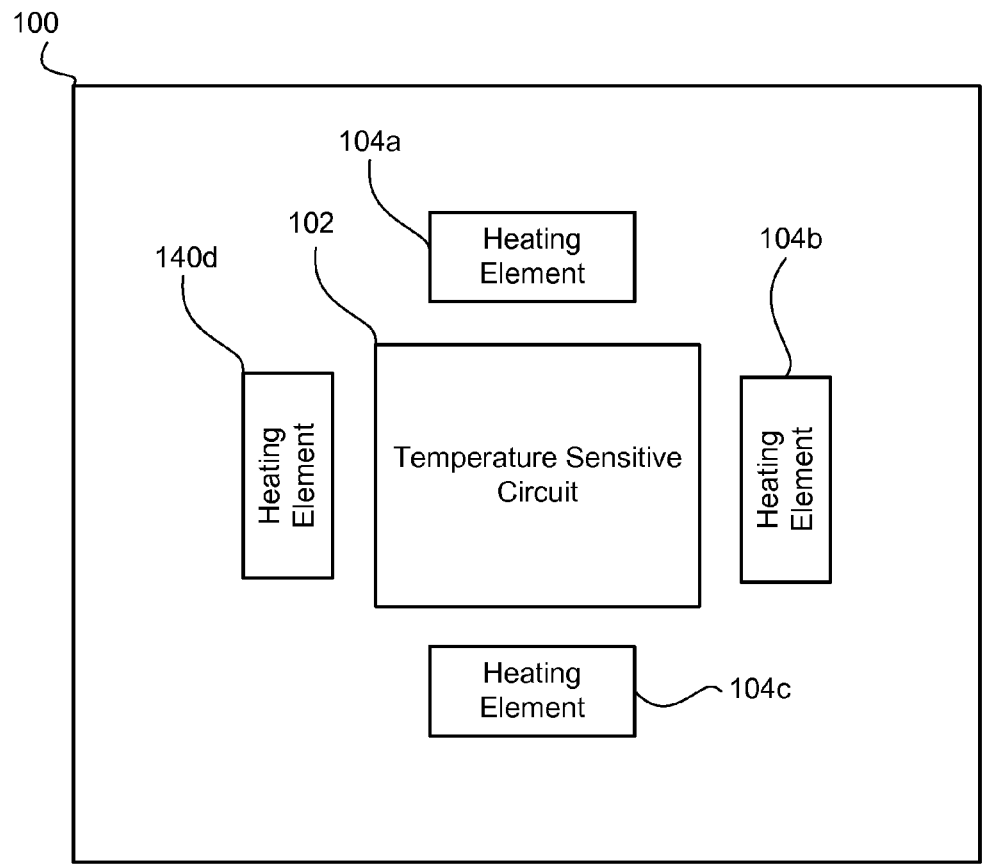
FIG. 1 is a top plan view of an example circuit with one or more heater elements.

FIG. 1 is a top plan view of an example circuit with one or more heater elements. In some implementations, a semiconductor substrate 100 includes a temperature sensitive circuit 102 and a number of heating elements 104 disposed on the substrate 100 proximate to the circuit 102. The circuit 102 can be any circuit that is required to be temperature stable, including but not limited to a bandgap circuit, oscillator or other kind of reference circuit. The heating elements 104 can be any devices capable of being disposed on the substrate 100 (e.g., p-type substrate) and that can be controlled to heat the substrate. In some implementations, the heating elements 104 can be transistors or resistors disposed on the substrate which can dissipate power in a controlled manner, as described in reference to FIG. 2. The heating elements 104 can be disposed on the substrate 100 so that they at least partially surround the circuit 102 as shown in FIG. 1. In some implementations, the heating elements 104 are coupled together to one or more control voltage sources. Any number of heater elements 104 can be disposed on the substrate 100 in any desired pattern to allow the temperature of circuit 102 to be elevated in a controlled manner. More than one circuit can be disposed on the substrate 100 and heated by the heating elements 104.

Example Heating Element

Figure 2:
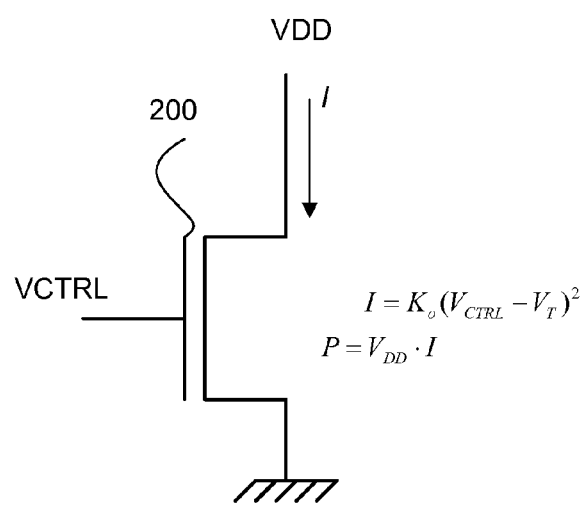
FIG. 2 is a schematic diagram of an example heating element.

FIG. 2 is a schematic diagram of an example heating element. In the case where a transistor is used as the heating element, the power dissipated by the transistor can be controlled by setting a gate voltage of the transistor. In the example shown, an n-channel, CMOS transistor 200 has a drain terminal connected to a voltage source VDD, a gate terminal coupled to a control voltage and a source terminal coupled to a voltage reference (e.g., connected to ground). The power dissipated by the transistor 200 in response to the control voltage, $V_{CTRL}$, applied to the gate can be given by the simplified equations [1] and [2] for a CMOS transistor operating in saturation or active mode (assuming the channel modulation factor $\lambda$ is 0)

$$I_D = K_o(V_{CTRL} - V_T)^2, \text{ and} \quad [1]$$

$$P = V_{DD} I_D, \quad [2]$$

where $V_{CTRL}$ is a control voltage (gate-to-source voltage), $I_D$, is the drain current, $V_{DD}$ is a source voltage, $$K_o = \frac{\mu_{ox} C_{ox}}{2} \frac{W}{L},$$

where $\mu_{ox}$ is the charge-carrier effective mobility, $C_{ox}$ is the gate oxide capacitance per unit area, W is the gate width, L is the gate length, and $V_T$ is the threshold voltage of the transistor. By adjusting $V_{CTRL}$, the drain current $I_D$ can be controlled and, by equation [2], the power dissipated by the transistor can be controlled. In some implementations, a single control voltage, $V_{CTRL}$, can be applied to the gates of a number of transistors disposed on the substrate 100 and patterned to completely surround, or at least partially surround, the circuit 102. In some implementations, a selected number of the total number of transistors can be controlled by one or more voltage sources. In some implementations, the heating elements 104 can be embedded in the substrate 100.

The transistor 200 is an example circuit that will give a controlled power dissipation. Other circuits are possible. For example, if the thermal conductivity of the package is 50° C./W, then only a few 100 milliwatts are used to elevate the temperature by several 10's of degrees which should be adequate for most purposes.

Example Calibration Process

Figure 3:
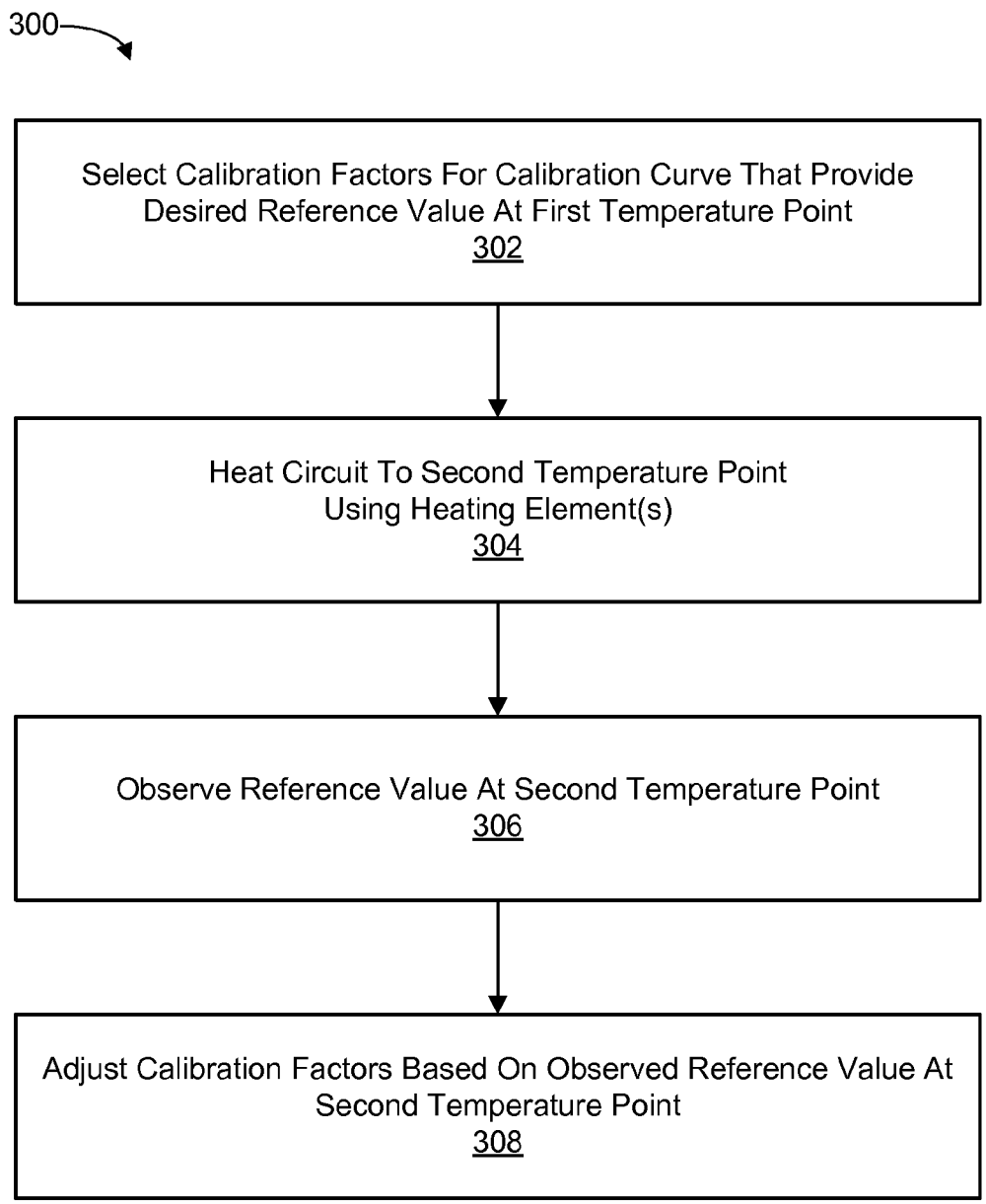
FIG. 3 is a flow diagram of a process for calibrating a temperature sensitive circuit using one or more heating elements.

FIG. 3 is a flow diagram of a process 300 for calibrating a temperature sensitive circuit using heating elements. In some implementations, the process 300 can begin by selecting calibration factors for a calibration curve that provides a desired reference value at a first temperature point (302). The circuit is heated to a second temperature point using one or more heating elements (304). The reference value is observed at the second temperature (306). The calibration factors are adjusted based on the observed reference value at the second temperature point (308).

Example Calibration Process for Bandgap Circuit

Figure 4:
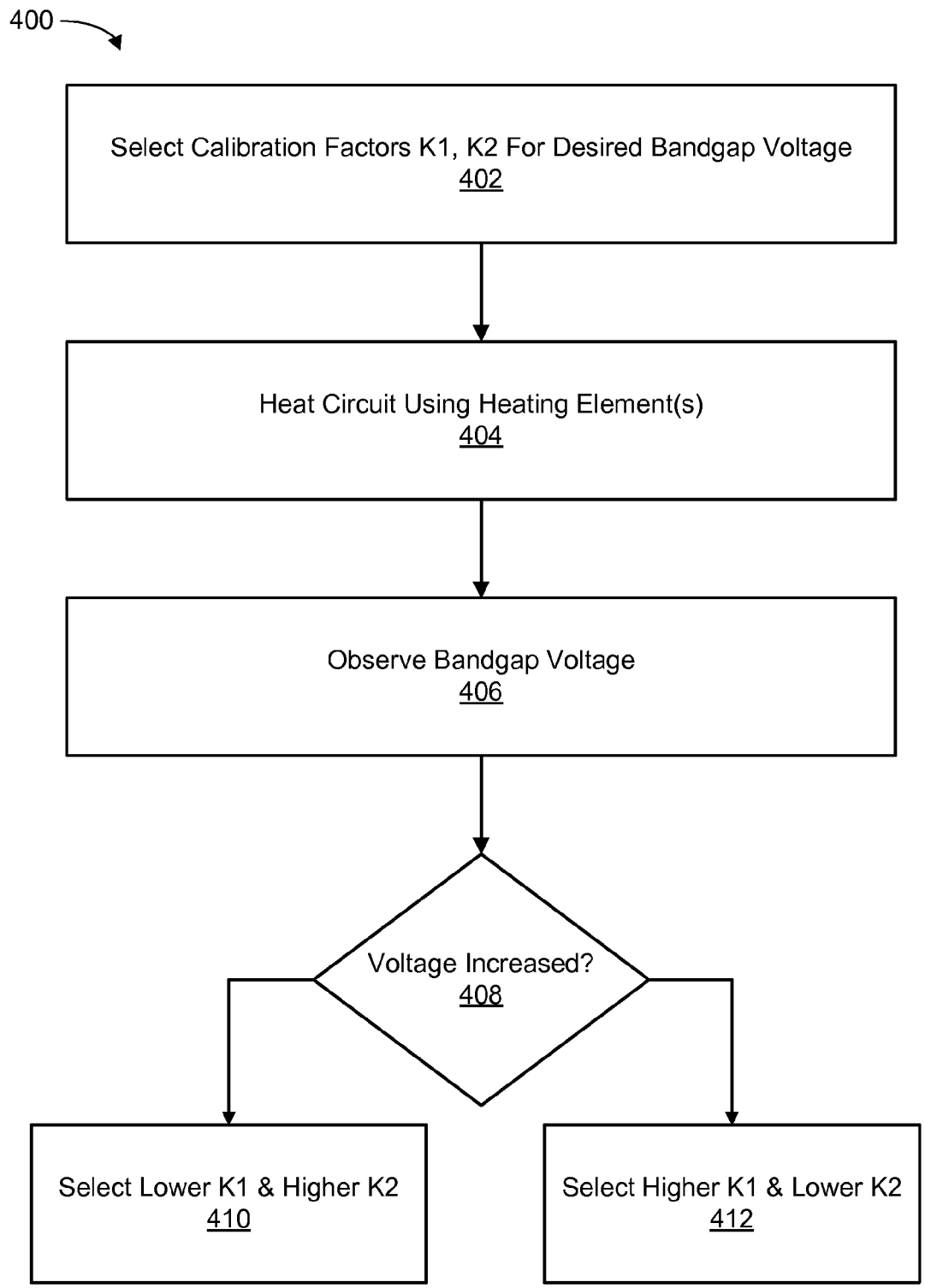
FIG. 4 is a flow diagram of a process for calibrating a bandgap circuit using one or more heating elements.

FIG. 4 is a flow diagram of a process for calibrating a bandgap circuit. A bandgap circuit is a common circuit used in electronic designs that provides a constant voltage across temperature. The bandgap voltage, $V_{BGAP}$, can be given by $$V_{BGAP} = k_1 T + k_2(T_o - T) + V_{BEO}, \qquad [3]$$

where $V_{BEO}$, $k_1$ and $k_2$ are process dependent parameters, $T_O$ is 25° C. and T is the temperature. In some implementations, $k_2$ is typically about 2 mV/° C. and $V_{BEO}$ is about 0.65 volts (dependent on $k_2$).

For bandgap circuits, $k_1$ and $k_2$ can be adjusted, and for a given $k_1$ a corresponding $k_2$ can be characterized. A calibration process 400 can begin by selecting values for $k_1$ and $k_2$ which gives a desired bandgap voltage (402). The bandgap circuit is heated using one or more heating elements (404). The bandgap voltage is observed (406). If the process 400 determines (408) that the observed bandgap voltage has increased, then a lower value for $k_1$ is selected and a higher value for $k_2$ is selected. If the process 400 determines (408) that the bandgap voltage has decreased, then a higher value for $k_1$ is selected and a lower value for $k_2$ is selected. A similar calibration process can be used for other temperature sensitive circuit elements (e.g., an oscillator).

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

What is claimed is:

1. A method of calibrating a circuit using one or more heating elements, comprising:
    setting a factor for a calibration curve that provides a reference value at a first temperature point;
    heating the circuit to a second temperature point using the one or more heating elements;
    observing the reference value at the second temperature point; and
    adjusting the calibration factor based on the observed reference value.

2. The method of claim 1, where the circuit is a bandgap circuit or an oscillator.

3. The method of claim 1, where at least one heating element is a transistor.

4. The method of claim 3, further comprising:
    applying a voltage to a gate of the transistor to control power dissipated by the transistor.

5. The method of claim 1, where the heating elements at least partially surround the circuit.

* * * * *